US006960951B2

(12) United States Patent
Confalonieri et al.

(10) Patent No.: US 6,960,951 B2
(45) Date of Patent: Nov. 1, 2005

(54) CIRCUIT FOR DETECTING A LOGIC TRANSITION WITH IMPROVED STABILITY OF THE LENGTH OF A DETECTION SIGNAL PULSE

(75) Inventors: Emanuele Confalonieri, Milan (IT); Marco Sforzin, Cantu' (IT); Carla Poidomani, Cassina de' Pecchi (IT); Carlo Lisi, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/698,051

(22) Filed: Oct. 30, 2003

(65) Prior Publication Data

US 2004/0140828 A1 Jul. 22, 2004

(30) Foreign Application Priority Data

Oct. 31, 2002 (IT) ..................................... MI2002A2314

(51) Int. Cl.[7] .............................................. H03K 3/17
(52) U.S. Cl. ........................... 327/172; 327/34; 327/36; 327/37; 327/38; 365/233.5
(58) Field of Search .............................. 327/34, 36–38, 327/172, 176, 227, 228; 365/233.5, 189.08; 326/93, 95, 98, 113

(56) References Cited

U.S. PATENT DOCUMENTS 5,650,979 A * 7/1997 Komarek et al. ........ 365/233.5
5,696,463 A * 12/1997 Kwon ......................... 327/172
5,734,282 A * 3/1998 Choi et al. .................. 327/227
5,774,707 A * 6/1998 Bae ............................. 713/600
6,021,089 A * 2/2000 Hwang ..................... 365/233.5

* cited by examiner

Primary Examiner—Vibol Tan
(74) Attorney, Agent, or Firm—Lisa K. Jorgenson; David V. Carlson; Seed IP Law Group PLLC

(57) ABSTRACT

A circuit for detecting a logic transition is proposed. The circuit includes an input terminal for receiving a logic signal, an output terminal for generating a detection signal, two capacitors, in a steady condition a first one of the capacitors and a second one of the capacitors being alternately at a first voltage and at a second voltage, respectively, and exchanging means for bringing the first capacitor to the second voltage and the second capacitor to the first voltage in response to a switching of the logic signal; the circuit further includes means for maintaining a command node at the first voltage in the steady condition, means for generating a reset pulse through the first capacitor in response to the switching, means for bringing the command node to the second voltage in response to the reset pulse, a generator of regulated current for bringing back the command node to the first voltage through the second capacitor, and logic means having a regulated threshold voltage comprised between the first and the second voltage, the logic means asserting the detection signal when the command node is brought to the second voltage and deasserting the detection signal when the command node reaches the threshold voltage.

17 Claims, 6 Drawing Sheets

CIRCUIT FOR DETECTING A LOGIC TRANSITION WITH IMPROVED STABILITY OF THE LENGTH OF A DETECTION SIGNAL PULSE

FIELD OF THE INVENTION

The present invention relates to a circuit for detecting a logic transition with improved stability of the length of a detection signal pulse.

BACKGROUND OF THE INVENTION

The circuits for detecting a logic transition (Logic Transition Detection, or LTD) are well known; those circuits generate a pulse-type detection signal in response to a transition of a logic signal (both with a leading edge from the logic value 0 to the logic value 1 and with a trailing edge from the logic value 1 to the logic value 0).

The LTD circuits commonly find application in devices that must be able to react to any switching of the logic signal (irrespectively of the type of edge of the transition). For example, the LTD circuits are used in an asynchronous memory device for enabling a reading operation following a switching of an input address; in this case, they are also known as Address Transition Detection (ATD) circuits.

Different structures have been proposed for implementing the LTD circuits. A known solution consists of applying the logic signal to a delay line. The logic signal so delayed is then compared with the original logic signal. When these two signals are equal, the detection signal is deasserted; conversely, the detection signal is asserted. In this way, each transition of the logic signal generates a pulse having a length equal to the introduced delay.

A drawback of the structure described above consists of the fact that it is very difficult to make delay lines that are accurate and with steady characteristics (for example, as a power supply voltage of the LTD circuit or its operating temperature change). Therefore, it is not possible to control the length of the detection signal pulse accurately.

A different solution known in the art provides the use of two capacitors, which are controlled by the logic signal and by its inverted value, respectively; the signals generated by the two capacitors are then compared. In a steady condition, the voltage at a capacitor is equal to a power supply voltage while the voltage at the other capacitor is equal to a reference voltage (or ground); as a consequence, the detection signal is deasserted. At each switching of the logic signal, the capacitor at the power supply voltage is discharged to ground and the capacitor at ground is charged to the power supply voltage (through respective MOS transistors); the circuit is dimensioned so that the charging time is always higher than the discharging time. As a consequence, the detection signal is asserted during the time interval in which both the signals generated by the two capacitors are lower than a preset threshold voltage.

However, the operation of this circuit is strongly dependent on its operative conditions as well. Particularly, an increase of the power supply voltage and/or a decrease of the temperature raise the conductivity of the MOS transistors, thereby reducing the length of the discharging and charging times of the capacitors; however, such reduction is almost imperceptible for the discharging (very fast). The decrease of the temperature also lowers the threshold voltage. It follows that the length of the detection signal pulse shortens as the power supply voltage increases and the temperature decreases.

Such variability of the length of the detection signal pulse is very harmful. For example, in a memory device the ATD circuit should be dimensioned so as to ensure a length of the pulse that guarantees the enabling of the reading operation in the worse operative condition of the circuit; therefore, in a standard operative condition the length of the pulse is higher than it is necessary, thereby increasing a reading access time of the memory device.

BRIEF SUMMARY OF THE INVENTION

Briefly, the present invention provides a circuit for detecting a logic transition including an input terminal for receiving a logic signal, an output terminal for generating a detection signal, two capacitors, in a steady condition a first one of the capacitors and a second one of the capacitors being alternately at a first voltage and at a second voltage, respectively, and exchanging means for bringing the first capacitor to the second voltage and the second capacitor to the first voltage in response to a switching of the logic signal, wherein the circuit further includes means for maintaining a command node at the first voltage in the steady condition, means for generating a reset pulse through the first capacitor in response to the switching, means for bringing the command node to the second voltage in response to the reset pulse, a generator of regulated current for bringing back the command node to the first voltage through the second capacitor, and logic means having a regulated threshold voltage comprised between the first and the second voltage, the logic means asserting the detection signal when the command node is brought to the second voltage and deasserting the detection signal when the command node reaches the threshold voltage.

Moreover, the present invention also proposes an asynchronous memory device comprising this circuit and a corresponding method of detection of a logic transition.

BRIEF DESCRIPTION OF THE DRAWINGS

Further features and the advantages of the solution according to the present invention will be made clear by the following description of a preferred embodiment thereof, given purely by way of a non-restrictive indication, with reference to the attached figures, in which.

DETAILED DESCRIPTION OF THE INVENTION

Figure 1:
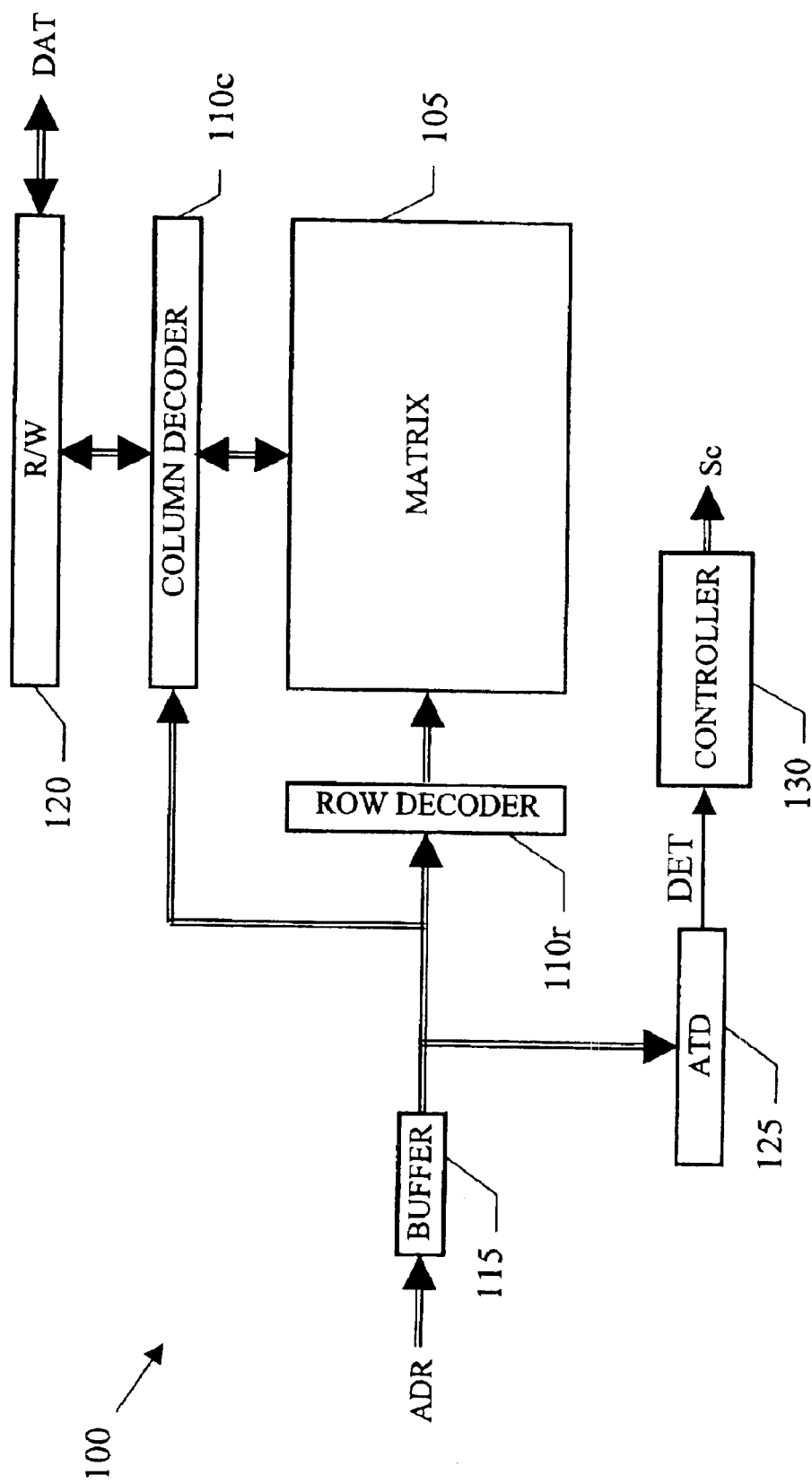
FIG. 1 is a schematic block diagram of an asynchronous memory device in which the circuit of the invention is used.

With reference in particular to FIG. 1, a memory device 100 of the asynchronous type (for example, a flash $E^2PROM$) is illustrated. The memory device 100 includes a matrix of memory cells 105. A column decoder 110c and a row decoder 110r are used for selecting the memory cells of the matrix 105 in response to an address ADR. The address ADR is received asynchronously from the outside; the address ADR is applied to a buffer 115, which drives the decoders 110c and 110r accordingly. The column decoder 110c also interfaces with a unit (R/W) 120, which includes the circuits required for reading and writing a block of data DAT in the selected memory cells.

The address ADR output by the buffer 115 is also provided to a circuit for detecting an address transition (ATD) 125. As described in detail in the following, the ATD circuit 125 outputs a detection signal DET, which is asserted for a brief period whenever the address ADR switches. The detection signal DET is applied to a controller 130, which generates a sequence of control signals (denoted as a whole with Sc) for the other units of the memory device 100; for example, the controller 130 enables the execution of a reading operation from the matrix 105 in response to each pulse of the detection signal DET.

Similar considerations apply if the memory device has another structure, or if the ATD circuit is used for enabling a different operation, or if the ATD circuit is inserted in a memory device of another type, and the like. The ATD circuit can be used in other memory devices or other circuits. The concepts of the present invention are generally applicable to a circuit for detecting a logic transition (LTD), which can be used in many other applications.

Figure 2A:
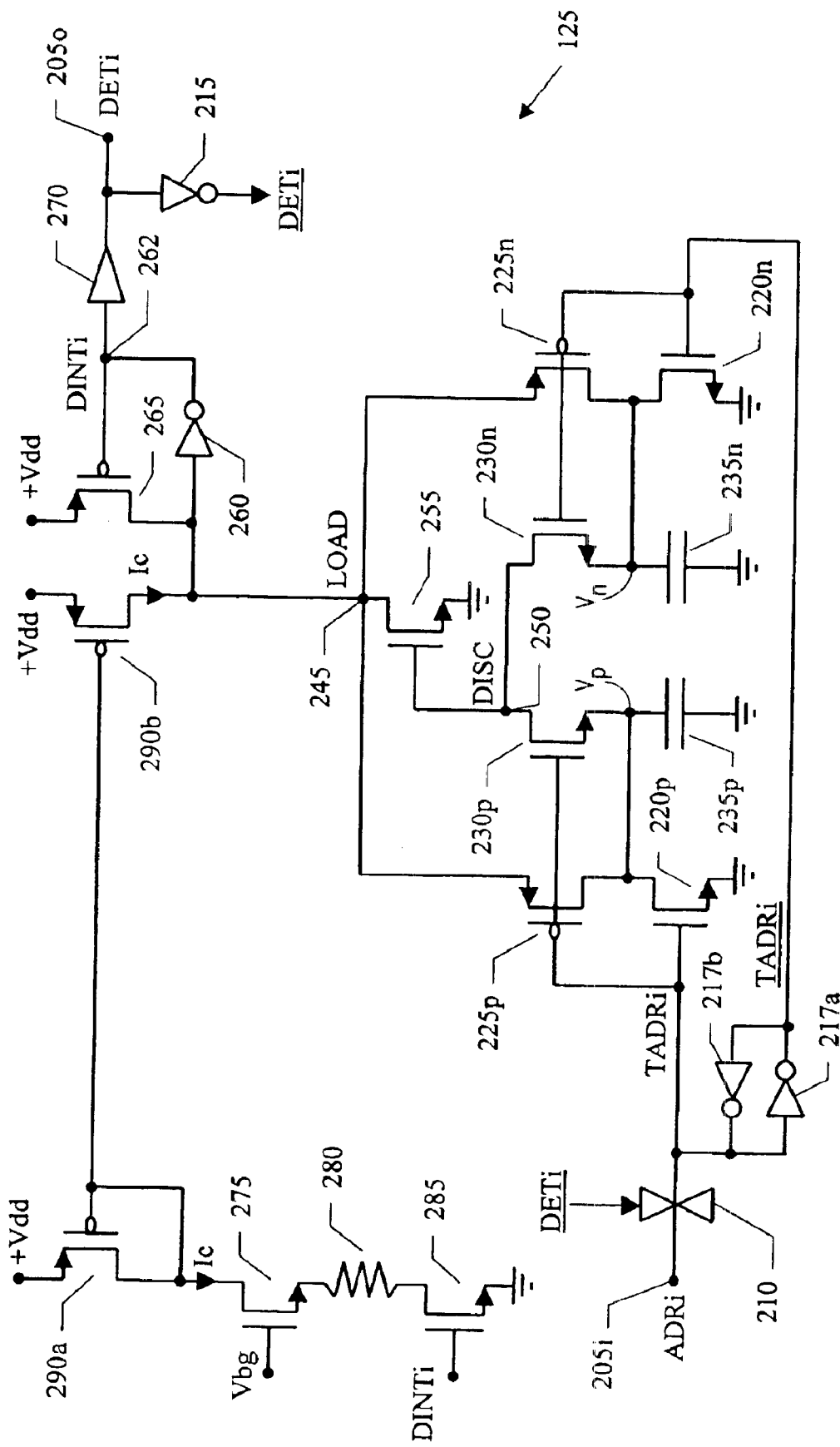
FIG. 2a shows a first embodiment of the circuit.

As shown in FIG. 2a, the ATD circuit 125 includes an input terminal 205i for each bit of the address (generically denoted with ADRi); an output terminal 205o provides a corresponding bit of the detection signal, denoted with DETi (all the signals DETi are OR-ed to obtain the general detection signal).

The address ADRi is applied to a filter that is formed by a transfer gate 210; the transfer gate 210 is enabled by the detection signal DETi inverted through a logic NOT gate 215 (signal DETi). The address ADRi transferred by the gate 210 (denoted with TADRi) is then applied to the input terminal of a logic NOT gate 217a; a further logic NOT gate 217b has the input terminal and the output terminal that are connected to the output terminal and to the input terminal, respectively, of the NOT gate 217a. In this way, the NOT gates 217a, 217b define a latch, which provides the transferred address TADRi (at the output terminal of the NOT gate 217b) and its inverted value denoted with TADRi (at the output terminal of the NOT gate 217a); such structure further ensures that each switching of the two signals TADRi and TADRi is substantially simultaneous.

The transferred address TADRi controls a first branch of a charge-exchanging block. Particularly, the transferred address TADRi is provided to the gate terminals of an NMOS transistor 220p, a PMOS transistor 225p, and an NMOS transistor 230p. The transistor 220p has the source terminal connected to a ground terminal. The drain terminal of the transistor 220p, the drain terminal of the transistor 225p and the source terminal of the transistor 230p are all connected to the first terminal of a capacitor 235p; the second terminal of the capacitor 235p is connected to the ground terminal. Likewise, the inverted transferred address TADRi controls a second branch of the charge exchange block (formed by an NMOS transistor 220n, a PMOS transistor 225n and an NMOS transistor 230n), which is associated with a capacitor 235n.

The source terminal of the transistor 225p and the source terminal of the transistor 225n are connected to each other so as to define a command node 245. The drain terminal of the transistor 230p and the drain terminal of the transistor 230n likewise define a common reset node 250. The signal at the reset node 250 (denoted with DISC) controls the gate terminal of an NMOS transistor 255. The source terminal of the transistor 255 is connected to the ground terminal, while its drain terminal is connected to the command node 245.

The signal at the command node 245 (denoted with LOAD) is provided to a digitizing logic block. Particularly, the command signal LOAD is input to a logic NOT gate 260. The output terminal of the inverter 260 defines an internal detection node 262, which is connected to the gate terminal of a PMOS transistor 265. The transistor 265 has the source terminal connected to a power supply terminal, which provides a voltage +Vdd (for example, 1.5V with respect to ground); the drain terminal of the transistor 265 is instead connected to the command node 245. The signal at the internal detection node 262 (denoted with DINTi) is also applied to a buffer 270; the output terminal of the buffer 270 is directly connected to the output terminal 205o.

The command node 245 is further coupled with a direct current generator. In detail, the current generator includes an NMOS transistor 275, which receives a reference voltage Vbg (for example, generated by a band-gap circuit) at its gate terminal. The source terminal of the transistor 275 is connected, through a resistor 280, to the drain terminal of a further NMOS transistor 285. The transistor 285 has the source terminal connected to the ground terminal, and receives the internal detection signal DINTi at its gate terminal. A current mirror that consists of two PMOS transistors 290a and 290b is interposed between the transistor 275 and the command node 245. Particularly, the drain terminal of the transistor 290a is connected to the drain terminal of the transistor 275, and the drain terminal of the transistor 290b is connected to the command node 245. Both the transistors 290a and 290b have the source terminals connected to the power supply terminal; the gate terminal of the transistor 290a is short-circuited to its drain terminal and to the gate terminal of the transistor 290b.

Figure 2B:
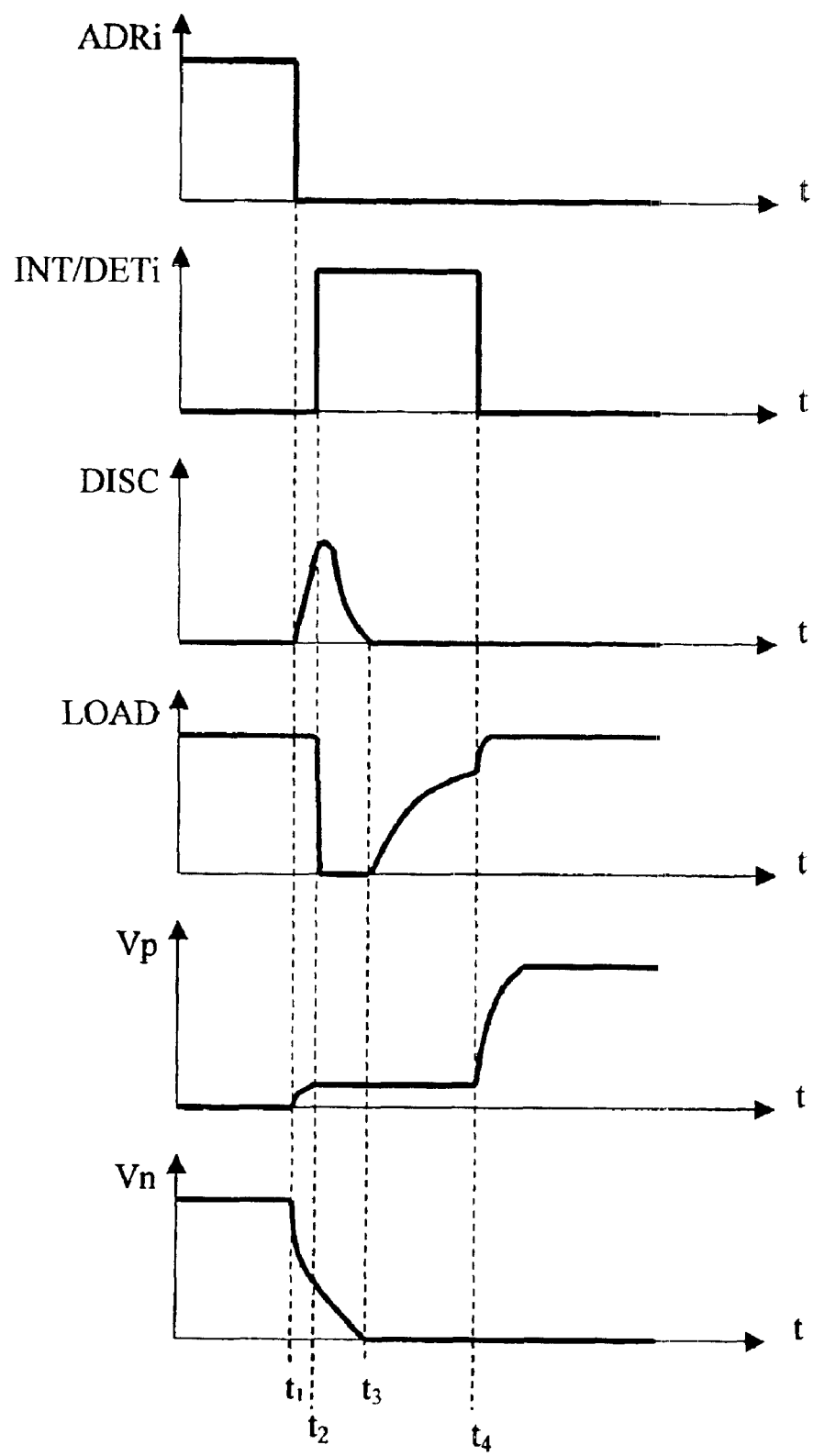
FIG. 2b illustrates the wave shapes of some electrical quantities of the circuit in a qualitative timing diagram.

Operation of the ATD circuit 125 is now described considering the FIG. 2a and the FIG. 2b together. In a steady condition (as will result in the following), the internal detection signal DINTi and the detection signal DETis are at a logic level 0 (0V). Therefore, the inverted detection signal DETi opens the transfer gate 210. In this way, the address ADRi is transferred and stored into the latch 217a, 217b. Assuming that the transferred address TADRi is at a logic level 1 (+Vdd), in the corresponding charge exchange branch the transistors 220p and 230p will be on, while the transistor 225p will be off. At the same time, the inverted transferred address TADRi is at the level 0; as a consequence, in the other branch of the charge exchange block the transistors 220n and 230n will be off, while the transistor 225n will be on.

In this way, the reset node 250 is maintained at ground by the transistors 230p and 220p; therefore, the transistor 255 is off. Conversely, the command node 245 is maintained at the power supply voltage by the transistor 265 (which is turned on by the internal detection signal DINTi at the value 0). It follows that the voltage at the capacitor 235p (denoted with Vp) is null, since its upper terminal is connected to ground through the transistor 220p; the voltage at the capacitor 235n (denoted with Vn) is instead equal to the power supply voltage, since its upper terminal is connected to the power supply terminal through the transistors 225n and 265. At the same time, the transistor 285 is turned off by the internal detection signal DINTi (at the value 0), and then operation of the whole current generator is disabled.

Let us assume that at a generic time $t_1$ the address ADRi switches from the value 1 to the value 0. As a consequence, the transferred address TADRi turns off the transistors 220p, 230p and turns on the transistor 225p. At the same time, the inverted transferred address TADRi (at the level 1) turns on the transistors 220n, 230n and turns off the transistor 225n.

In this way, the capacitor 235*n* is connected to the reset node 250 through the transistor 230*n*. The charge of the capacitor 235*n* is shared with the reset node 250; denoting with Cn the capacity of the capacitor 235*n* and with Cs the stray capacity of the reset node 250, the voltage Vn at the capacitor 235*n* and the reset signal DISC are brought to the value:

$$Vn, DISC = Vdd \frac{Cn}{Cn + Cs}$$

Such phenomenon of charge sharing is very fast, with a time constant defined by the capacities Cn, Cs and a resistance of the transistor 230*n*. Meanwhile, the voltage Vp at the capacitor 235*p* slightly increases because of the connection to the command node 245 through the transistor 225*p*. As soon as the reset signal DISC (at the node 250) reaches the threshold voltage of the transistor 255 (time $t_2$), such transistor is turned on; the command node 245 is then brought immediately to ground (stopping the charging of the capacitor 235*p*).

As a consequence, the internal detection signal DINTi and then also the detection signal DETis switch to the value 1. The transistor 265 is turned off by the internal detection signal DINTi. Moreover, the internal detection signal DINTi turns on the transistor 285, which enables operation of the current generator. Particularly, the reference voltage Vbg drives the transistor 275 so that it provides a current Ic independent of the temperature and the power supply voltage; the current Ic is then mirrored by the transistors 290*a*, 290*b* towards the command node 245. At the same time, the inverted detection signal DETi closes the transfer gate 210; in this way, the signals TADRi and TADRi remain equal to the values stored in the latch 217*a*, 217*b* thereby masking any further switching of the address ADRi.

Meanwhile, the capacitor 235*n* continues discharging to ground through the transistor 220*n*, accordingly lowering the voltage at the reset node 250 as well (through the transistor 230*n*). Such phenomenon is also very fast, with a time constant defined by the capacity Cn and a resistance of the transistor 220*n*. When at the time $t_3$ the voltage at the reset node 250 falls below the threshold voltage of the transistor 255 (terminating the pulse of the reset signal DISC), such transistor is turned off again.

The command node 245 then begins charging through the current Ic (provided by the transistor 290*b*), until the command signal LOAD reaches the threshold voltage of the NOT gate 260 (time $t_4$); in this respect, it should be noted that the transistor 265 is feedback connected to the NOT gate 260, so as to regulate its threshold voltage (as the power supply voltage and the temperature change). As a consequence, the internal detection signal DINTi and then also the detection signal DETis switch again to the value 0. The internal detection signal DINTi then turns off the transistor 285, thereby disabling operation of the current generator. Moreover, the inverted detection signal DETi opens the transfer gate 210 again. At the same time, the transistor 265 is turned on by the internal detection signal DINTi. In this way, the voltage at the command node 245 and the voltage Vp at the capacitor 235*p* are brought very quickly to the power supply voltage.

The behaviour of the ATD circuit 125 is similar in response to a switching of the address ADRi from the value 0 to the value 1. The symmetry of the charge exchange block also ensures that the starting condition of the command node 245 is always the same, irrespective of the edge of the transition.

In any case, the concepts of the present invention are also applicable when an equivalent filter is provided for the address, when the current generator is made in a different way, or when an equivalent circuit is used for regulating the threshold voltage of the NOT gate that generates the internal detection signal. Alternatively, the NMOS and PMOS transistors are replaced with equivalent electronic switches, the ATD circuit has a dual behaviour (with the current Ic that is used for discharging the command node LOAD), and the like.

Figure 3A:
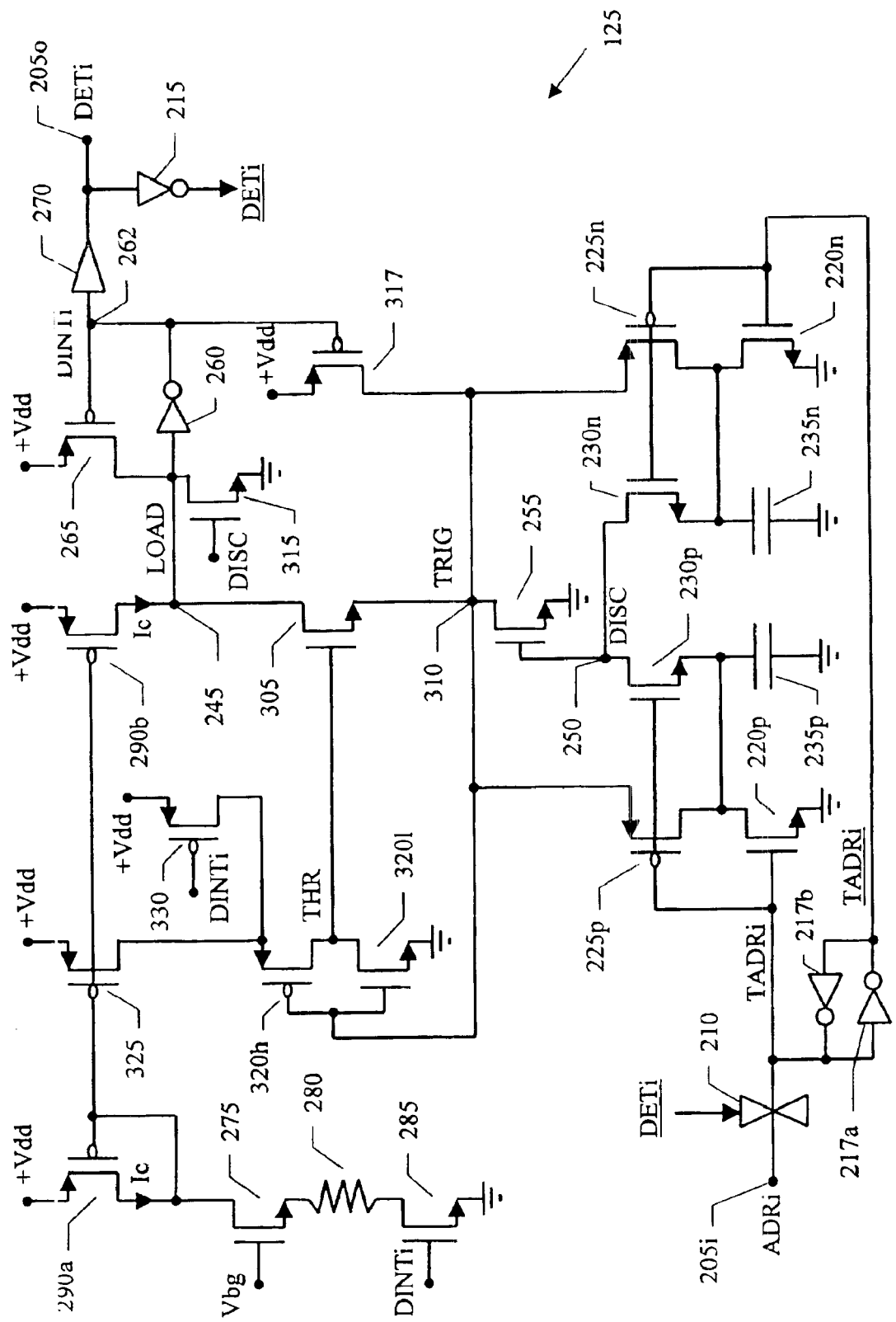
FIG. 3a represents a second embodiment of the circuit.

A different embodiment of the ATD circuit 125 is illustrated in FIG. 3*a* (the elements corresponding to the ones shown in the FIG. 2*a* are denoted with the same references, and their explanation is omitted for the sake of simplicity).

In this case, an NMOS transistor 305 is interposed between the command node 245 and the drain terminal of the transistor 255 (which defines a trigger node, denoted with 310). Particularly, the transistor 305 has the source terminal connected to the source terminals of the transistors 225*p* and 225*n*, and the drain terminal connected to the drain terminal of the transistor 290*b* and to the input terminal of the NOT gate 260. A further NMOS transistor 315 has the drain terminal connected to the command node 245, while its source terminal is connected to the ground terminal; the gate terminal of the transistor 315 receives the reset signal DISC. Moreover, the internal detection signal DINTi (at the output terminal of the NOT gate 260) controls the gate terminal of a PMOS transistor 317. The transistor 317 has the source terminal connected to the power supply terminal and the drain terminal connected to the trigger node 310.

The transistor 305 is driven by a regulation block. Particularly, a logic NOT gate is formed by an NMOS transistor 320*l* and a PMOS transistor 320*h*. The gate terminals of the transistors 320*l* and 320*h* are connected to each other, so as to define the input terminal of the NOT gate 320*l*, 320*h* (to which the trigger signal TRIG is applied). The transistor 320*l* has the source terminal connected to the ground terminal. The drain terminals of the transistors 320*l* and 320*h* are connected to each other, so as to define the output terminal of the NOT gate 320*l*, 320*h*. The signal at the output terminal of the NOT gate 320*l*, 320*h* (denoted with THR) is applied to the gate terminal of the transistor 305.

The NOT gate 320*l*, 320*h* has a twofold biasing structure. Particularly, a PMOS transistor 325 defines a further branch of the mirror of the current generator. For this purpose, the transistor 325 has the gate terminal connected to the gate terminal of the transistor 290*a*; the source terminal of the transistor 325 is connected to the power supply terminal, while its drain terminal is connected to the source terminal of the transistor 320*h*. A further PMOS transistor 330 has the source terminal connected to the power supply terminal and the drain terminal connected to the source terminal of the transistor 320*h*; the gate terminal of the transistor 330 is controlled by the internal detection signal DINTi.

Figure 3B:
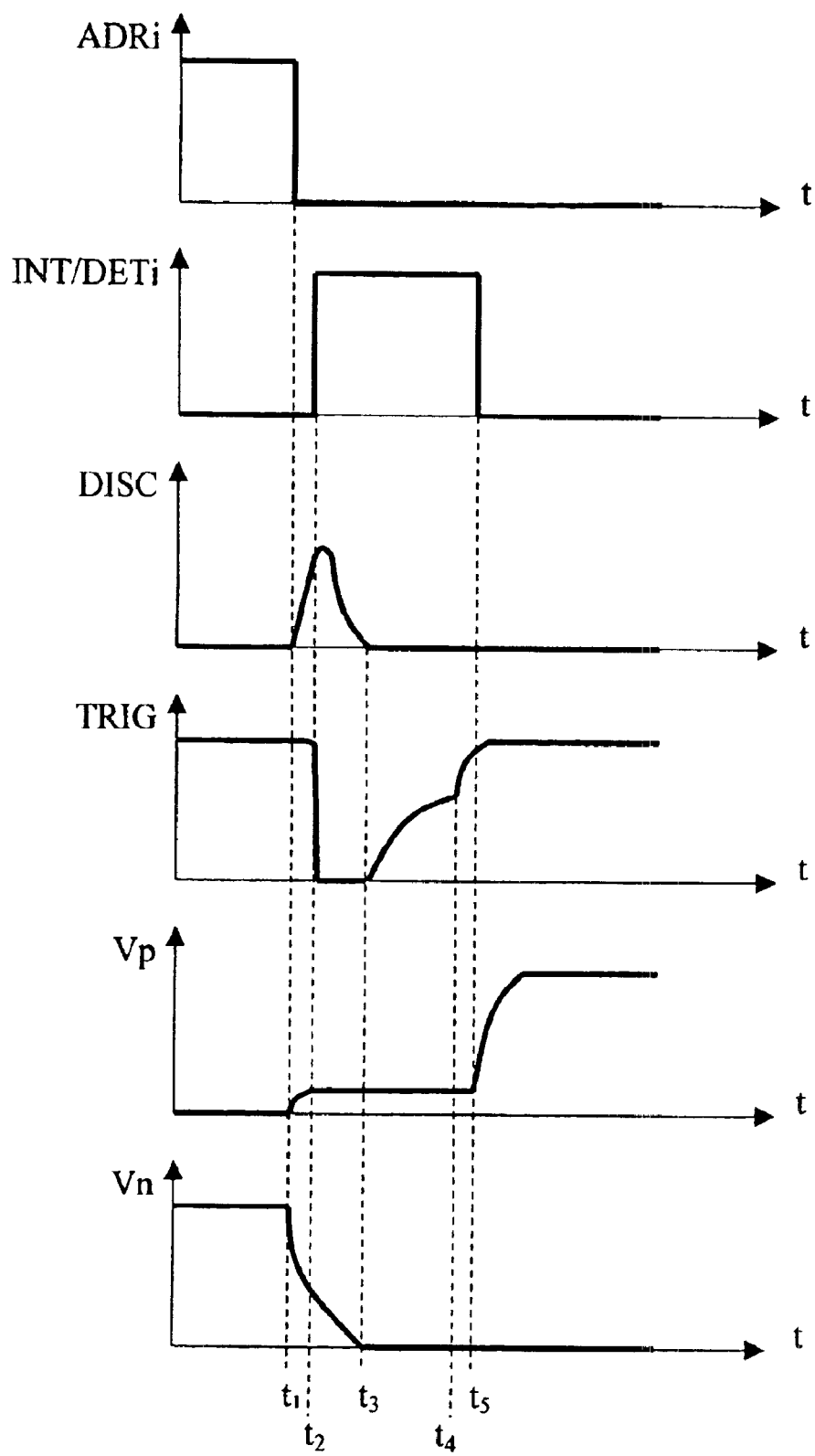
FIG. 3b is a timing diagram relating to operation of the second embodiment of the circuit.

Operation of the ATD circuit 125 is now described considering the FIG. 3*a* and the FIG. 3*b* together. As in the previous case, in a steady condition the internal detection signal DINTi and the detection signal DETis are at the level 0, so that the inverted detection signal DETi opens the transfer gate 210. Assuming that the transferred address TADRi is at the level 1, the transistors 220*p* and 230*p* will be on, while the transistor 225*p* will be off. At the same time, the inverted transferred address TADRi (at the level 0) turns off the transistors 220*n*, 230*n* and turns on the transistor 225*n*.

In this way, the reset node 250 is maintained at ground by the transistors 230*p* and 220*p*; therefore, the transistor 255 and the transistor 315 are off. Conversely, the charging node 245 and the trigger node 310 are maintained at the power supply voltage by the transistor 265 and the transistor 317, respectively (which are turned on by the internal detection signal DINTi at the value 0). It follows that the voltage Vp at the capacitor 235*p* is null, since its upper terminal is connected to ground through the transistor 220*p*; the voltage Vn at the capacitor 235*n* is instead equal to the power supply voltage, since its upper terminal is connected to the power supply terminal through the transistors 225*n* and 317.

At the same time, the transistor 285 is turned off by the internal detection signal DINTi (at the value 0), so that operation of the current generator is disabled. The internal detection signal DINTi instead turns on the transistor 330, which biases the NOT gate 320*l*, 320*h*. The control signal THR is then at the level 0 (in response to the trigger signal TRIG at the level 1); as a consequence, the transistor 305 is turned off.

Let us assume now that at a generic time $t_1$ the address ADRi switches from the value 1 to the value 0. As a consequence, the transferred address TADRi turns off the transistors 220*p*, 230*p* and turns on the transistor 225*p*. At the same time, the inverted transferred address TADRi (at the level 1) turns on the transistors 220*n*, 230*n* and turns off the transistor 225*n*.

The charge on the capacitor 235*n* is then shared with the reset node 250 (through the transistor 230*n*). Meanwhile, the voltage Vp at the capacitor 235*p* slightly increases because of the connection to the trigger node 310 through the transistor 225*p*.

As soon as the reset signal DISC (at the node 250) reaches the threshold voltage of the transistors 255 and 315 (time $t_2$), such transistors are turned on; the trigger node 310 and the command node 245 are then brought immediately to ground (stopping the charging of the capacitor 235*p*).

As a consequence, the control signal THR switches to the level 1, thereby turning on the transistor 305; such transition is very quick, thanks to the high current provided to the NOT gate 320*l*, 320*h* by the transistor 330. At the same time, the internal detection signal DINTi and the detection signal DETis switch to the value 1. The transistor 265 and the transistor 317 are then turned off (by the internal detection signal DINTi). Moreover, the internal detection signal DINTi turns off the transistor 330 and turns on the transistor 285 (which enables operation of the current generator). In this way, the NOT gate 320*l*, 320*h* is biased by the direct current Ic, so as to regulate its threshold voltage (as the power supply voltage and the temperature change). At the same time, the inverted detection signal DETi closes the transfer gate 210 (to mask any further switching of the address ADRi).

Meanwhile, the capacitor 235*n* continues discharging to ground through the transistor 220*n*, accordingly lowering the voltage at the reset node 250 (through the transistor 230*n*). When at the time $t_3$ the voltage at the reset node 250 falls below the threshold voltage of the transistors 255 and 315 (terminating the pulse of the reset signal DISC), such transistors are turned off again.

The trigger node 310 and the command node 245 then begin charging through the current Ic provided by the transistors 290*b* and 305. As soon as the trigger signal TRIG reaches the threshold voltage of the NOT gate 320*l*, 320*h* (time $t_4$), the control signal THR switches to the level 0 again, thereby turning off the transistor 305. The command node 245 is then bought to the power supply voltage (time $t_5$) very quickly (through the transistor 290*b*).

As a consequence, the internal detection signal DINTi and the detection signal DETis switch to the value 0 again. The internal detection signal DINTi then turns off the transistor 285 (disabling operation of the current generator) and turns on the transistor 330. Moreover, the inverted detection signal DETi opens the transfer gate 210 again. At the same time, the transistor 265 and the transistor 317 are turned on by the internal detection signal DINTi. In this way, the voltage at the trigger node 310 and the voltage Vp at the capacitor 235*p* are brought to the power supply voltage very quickly.

The behaviour of the circuit ATD 125 in similar in response to a switching of the address ADRi from the value 0 to the value 1.

In any case, the concepts of the present invention are also applicable when the trigger node is controlled in another way, when a different implementation of the regulation block is envisaged, when the regulation block is used for regulating the threshold voltage of the NOT gate that generates the internal detection signal, and the like.

Figure 4:
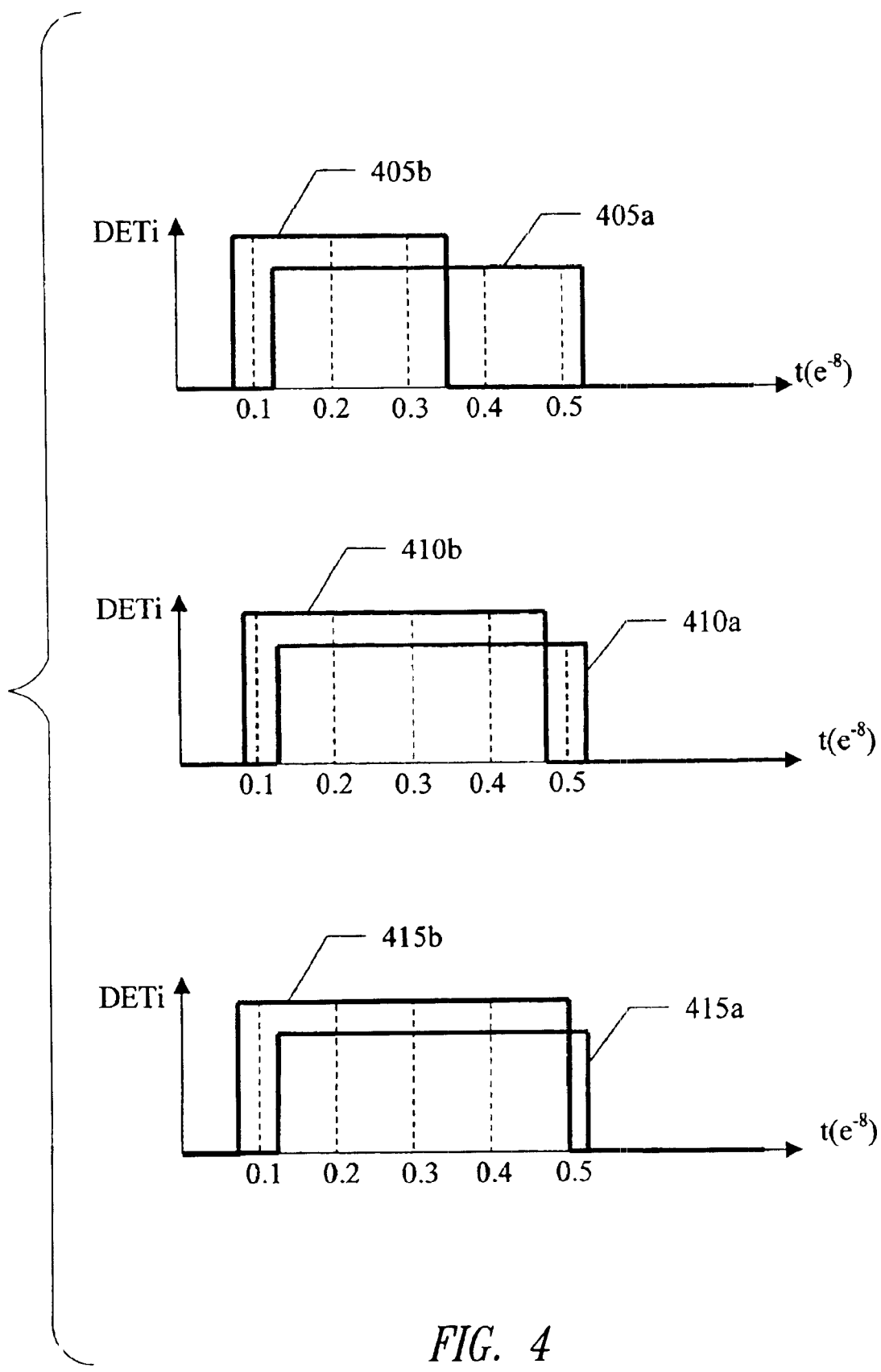
FIG. 4 shows the characteristics of a detection signal as the operative conditions change.

The characteristics of the pulse of the detection signal DETi (as the operative conditions of the ATD circuit change) are compared in FIG. 4. Particularly, the wave shape 405*a* represents the pulse obtained with a known ATD circuit operating at a power supply voltage +Vdd=1.6V and at a temperature T=80° C. If the power supply voltage is increased to +Vdd=2V and the temperature is lowered to T=−40° C., the length of the pulse is strongly reduced, as shown by the wave shape 405*b*.

Conversely, in the ATD circuit illustrated in FIG. 2*a* the stability of the length of the pulse of the detection signal DETi is remarkably improved; such result is evident comparing the wave shape 410*a* (obtained with the power supply voltage +Vdd=1.6V and the temperature T=80° C.) with the wave shape 410*b* (obtained with the power supply voltage +Vdd=2V and the temperature T=−40° C.).

The stability of the length of the pulse of the detection signal DETi is further improved in the ATD circuit of the FIG. 3*a*, as clearly results from the wave shapes 415*a* (+Vdd=1.6V, T=80° C.) and 415*b* (+Vdd=2V, T=−40° C.).

Similar considerations apply if the ATD circuit is used with different power supply voltages and/or at different operation temperatures, if the detection signal pulses have another wave shape, and the like.

More generally, the present invention proposes a circuit for detecting a logic transition. The circuit is provided with an input terminal for receiving a logic signal, and an output terminal for generating a detection signal. The circuit further includes two capacitors; in a steady condition a first one of the capacitors and a second one of the capacitors are alternately at a first voltage and at a second voltage, respectively. Exchanging means are provided for bringing the first capacitor to the second voltage and the second capacitor to the first voltage in response to a switching of the logic signal. The circuit of the invention is further provided with means for maintaining a command node at the first voltage in the steady condition. Moreover, the circuit includes means for generating a reset pulse through the first capacitor in response to the switching, and means for bringing the command node to the second voltage in response to the reset pulse. A generator of regulated current is used for bringing back the command node to the first voltage through the second capacitor. At the end, the circuit includes logic means having a regulated threshold voltage (comprised between the first and the second voltage); the logic means asserts the detection signal when the command node is brought to the second voltage and deasserts the detection signal when the command node reaches the threshold voltage.

The proposed solution exhibits an excellent stability of the length of the detection signal pulse (as the operative conditions of the circuit change).

Indeed, the reset pulse asserts the detection signal almost immediately. The generator of regulated current also ensures that the time required to the command node for reaching the threshold voltage of the logic means (which voltage is regulated as well) is substantially constant.

Such combined actions do make the length of the detection signal pulse substantially independent of the power supply voltage and the temperature.

The preferred embodiment of the invention described above offers further advantages.

Particularly, the reset pulse is generated connecting the corresponding node to the capacitor that is currently charged.

The proposed structure is very simple, but at the same time effective.

Preferably, the command node is connected to ground in response to the reset pulse.

This allows starting the detection signal pulse in a very fast way.

In an advantageous embodiment of the present invention, operation of the current generator is enabled by the detection signal.

This additional feature reduces the power consumption in the steady condition of the circuit.

However, the structure according to the present invention leads itself to be implemented with another circuitry for generating the reset signal, with the command node that is reset in a different way, or even with the current generator that is always enabled.

A way to further improve the solution consists of filtering the logic signal.

This allows avoiding anomalous behaviours of the circuit, caused by switchings of the logic signal at a too high frequency.

Preferably, the filter of the logic signal is enabled by the detection signal directly.

In this way, any switching of the logic signal during the detection signal pulse is automatically masked.

In a particularly advantageous embodiment of the invention, a regulation block is provided that disconnects the command node from the capacitor currently under charge when another regulated threshold voltage is reached.

Such additional feature further improves the stability of the length of the detection pulse.

A suggested choice for the regulation block consists of an inverter that is alternately biased through a current having a high value (when the detection signal is deasserted) or through the regulated current provided by the generator (when the detection signal is asserted).

The devised solution allows turning on the transistor that connects the command node to the current generator very fast at the beginning of the detection signal pulse; at the same time, it ensures a good stability of the threshold voltage of the regulation block.

In any case, the circuit of the present invention leads itself to be implemented also making the filter in a different way, providing another structure for the regulation block, or even without any filter and/or without any regulation block.

The proposed circuit is particularly advantageous in an asynchronous memory device (since it allows dimensioning the length of the detection signal pulse in a more accurate way, thereby reducing an access time of the memory device).

However, different applications of the circuit according to the present invention (for example, in a generic LTD circuit) are encompassed.

Naturally, in order to satisfy local and specific requirements, a person skilled in the art may apply to the solution described above many modifications and alterations all of which, however, are included within the scope of protection of the invention as defined by the following claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A circuit for detecting a logic transition comprising:
   an input terminal receiving a logic signal;
   an output terminal generating a detection signal;
   a first capacitor;
   a second capacitor;
   an exchanging means for bringing the first capacitor from a first voltage to a second voltage and the second capacitor from the second voltage to the first voltage in response to a switching of the logic signal;
   means for maintaining a command node at the first voltage in the steady condition;
   means for generating a reset pulse through the first capacitor in response to the switching;
   means for bringing the command node to the second voltage in response to the reset pulse;
   a generator of current means for bringing back the command node to the first voltage through the second capacitor; and
   logic means having a regulated threshold voltage comprised between the first and the second voltage, the logic means asserting the detection signal when the command node is brought to the second voltage and deasserting the detection signal when the command node reaches the threshold voltage.

2. The circuit according to claim 1 wherein the means for generating the reset pulse includes an electronic switch for connecting a reset node providing the reset pulse to the first capacitor.

3. The circuit according to claim 1 wherein the means for bringing the command node to the second voltage includes a further electronic switch for connecting the command node to a power supply terminal providing the second voltage in response to the reset pulse.

4. The circuit according to claim 1, further including means for enabling the current generator means in response to the detection signal.

5. The circuit according to claim 1, further including filtering means for filtering the logic signal.

6. The circuit according to claim 5, further including means for enabling the filtering means in response to the detection signal.

7. The circuit according to claim 1, further including connecting means for selectively connecting the command node to the second capacitor, and regulating means, having a further regulated threshold voltage, for enabling the connecting means when the command node is brought to the second voltage and for disabling the connecting means when the command node reaches the further threshold voltage.

8. The circuit according to claim 7 wherein the regulating means includes a logic gate controlling the transferring means, first biasing means of the logic gate for applying the regulated current provided by the current generator means and second biasing means of the logic gate for applying a further current higher than the regulated current, the first biasing means being enabled when the detection signal is asserted and the second biasing means being enabled when the detection signal is deasserted.

9. An asynchronous memory device including a matrix of memory cells, means for receiving a selection address of the memory cells, the circuit according to claim 1 for detecting a switching of the address and means for enabling an operation on the memory cells selected by the address in response to the detection of the switching.

10. A circuit for detecting logic transition comprising:
an input terminal;
an output terminal;
a first logic circuit coupled to the input terminal, an output of the circuit first logic transitioning from a first logic level to a second logic level based on an input signal at the input terminal changing state;
a second logic circuit coupled to the input terminal, an output of the second logic circuit transitioning from the second logic level to the first logic level upon a signal at the input terminal changing state; and
a pulse generation circuit coupled to both the first logic circuit and the second logic circuits an output of the pulse generation circuit having an initial logic level and changing logic levels upon the first or second logic circuits transitioning to different logic states and returning to the initial logic level after a selected period of time, the pulse generation circuit including a first capacitor.

11. The circuit according to claim 10 wherein the pulse generation circuit includes a second capacitor and the voltage charge level of the first capacitor and the second capacitor change logic states each time an input signal applied at the input terminal changes logic states.

12. The circuit according to claim 10, further including an output drive circuit coupled to the pulse generation circuit which drives the output terminal.

13. The circuit according to claim 12 wherein the pulse generation circuit includes an inverter.

14. The pulse generation circuit according to claim 10 wherein the first logic circuit includes an inverter.

15. A method of detecting a logic transition comprising:
maintaining a first capacitor and a second capacitor alternately at a first voltage and at a second voltage, respectively;
receiving an input logic signal;
maintaining a command node at the first voltage in the steady condition;
generating a reset pulse through the first capacitor in response to the switching;
bringing the command node to the second voltage in response to the reset pulse;
asserting the detection signal when the command node is brought to the second voltage;
bringing back the command node to the first voltage through the second capacitor using a generator of regulated current; and
deasserting the detection signal when the command node reaches a threshold voltage comprised between the first and the second voltage.

16. The method according to claim 15, further including temporarily driving an internal node from a first logic level to a second logic level and bringing the internal node back to the first logic level after a selected period of time.

17. The method according to claim 16 wherein the selected period of time is based on the charge rate of the first capacitor.

* * * * *